(12) United States Patent
Chen

(10) Patent No.: US 7,563,346 B2
(45) Date of Patent: Jul. 21, 2009

(54) MOLDS HAVING MULTILAYER DIAMOND-LIKE CARBON FILM AND METHOD FOR MANUFACTURING SAME

(75) Inventor: Ga-Lane Chen, Fremont, CA (US)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 55 days.

(21) Appl. No.: 11/309,816

(22) Filed: Oct. 3, 2006

(65) Prior Publication Data
US 2007/0119703 A1 May 31, 2007

(30) Foreign Application Priority Data
Nov. 25, 2005 (CN) .................. 2005 1 0101790

(51) Int. Cl.
*C23C 14/34* (2006.01)
(52) U.S. Cl. .............. 204/192.15; 204/192.1; 204/192.12; 204/192.16; 427/577
(58) Field of Classification Search ......... 427/577; 204/192.1, 192.12, 192.15, 192.16
See application file for complete search history.

(56) References Cited
U.S. PATENT DOCUMENTS

| | | | | |
|---|---|---|---|---|
| 5,232,570 A | * | 8/1993 | Haines et al. | 204/192.16 |
| 5,507,930 A | * | 4/1996 | Yamashita et al. | 204/192.15 |
| 5,837,357 A | * | 11/1998 | Matsuo et al. | 427/577 |
| 5,846,613 A | * | 12/1998 | Neuville | 204/192.12 |
| 6,475,573 B1 | | 11/2002 | Veerasamy et al. | |
| 6,576,095 B2 | * | 6/2003 | Chen | 204/192.16 |
| 7,175,926 B2 | * | 2/2007 | Ma et al. | 204/192.2 |

* cited by examiner

*Primary Examiner*—Archene Turner
(74) *Attorney, Agent, or Firm*—Frank R. Niranjan

(57) ABSTRACT

A mold having a multilayer diamond-like carbon film is provided. The mold includes: a molding surface; an adhesive layer formed on the molding surface; a densified layer formed on the adhesive layer, the adhesive layer being configured for enhancing bonding strength between the densified layer and the molding surface, and the densified layer being configured for enhancing a density of the multilayer diamond-like carbon film; an amorphous nitrogen-doped diamond-like carbon layer on the densified layer; an amorphous nitrogen-hydrogen-doped diamond-like carbon layer formed on the amorphous nitrogen-doped diamond-like carbon layer; and an amorphous hydrogen-doped diamond-like carbon layer formed on the nitrogen-hydrogen-doped diamond-like carbon layer.

19 Claims, 9 Drawing Sheets

MOLDS HAVING MULTILAYER DIAMOND-LIKE CARBON FILM AND METHOD FOR MANUFACTURING SAME

TECHNICAL FIELD

The present invention relates to molds and a method for manufacturing molds, and more particularly to a mold having a multilayer diamond-like carbon film and a method for manufacturing the mold.

DISCUSSION OF RELATED ART

Diamond-like carbon (DLC) is an amorphous form of carbon containing both of sp3 and sp2 bonded carbon atoms. According to the contents of the hydrogen atom, the DLC can be classified as amorphous hydrogen-doped DLC or as amorphous DLC.

Generally, single layer hydrogen-doped DLC film is widely used as a protective coating for molds due to its wear-resistance and low-friction coefficient. In a process of molding, a mold having DLC film coatings is capable of withstanding high impact force and friction. However, the single layer hydrogen-doped DLC film has a high internal stress, poor mechanical properties and unfavorable adhesion to a surface of a substrate, therefore such DLC coatings are likely to peel from the mold and have shortened lifetime.

Therefore, what is needed in the art is to provide a mold having better adhesion, higher corrosion resistance, and good wear resistance.

SUMMARY

In one embodiment, a mold having a multilayer diamond-like carbon film is provided. The mold includes: a molding surface; an adhesive layer formed on the molding surface; a densified layer formed on the adhesive layer, the adhesive layer being configured for enhancing bonding strength between the densified layer and the molding surface, and the densified layer being configured for enhancing a density of the multilayer diamond-like carbon film; an amorphous nitrogen-doped diamond-like carbon layer on the densified layer; an amorphous nitrogen-hydrogen-doped diamond-like carbon layer formed on the amorphous nitrogen-doped diamond-like carbon layer; and an amorphous hydrogen-doped diamond-like carbon layer formed on the nitrogen-hydrogen-doped diamond-like carbon layer.

In another embodiment, a method for manufacturing molds having a multilayer diamond-like carbon film is provided. The method includes the steps of: providing a mold preform having a molding surface; depositing an adhesive layer on the molding surface of the mold preform using a radio frequency sputtering deposition; depositing a densified layer on the adhesive layer using radio frequency sputtering deposition; depositing an amorphous nitrogen-doped diamond-like carbon layer on the densified layer using radio frequency sputtering deposition; depositing an amorphous nitrogen-hydrogen-doped diamond-like carbon layer on the amorphous nitrogen-doped diamond-like carbon layer using radio frequency sputtering deposition; depositing an amorphous hydrogen-doped diamond-like carbon layer on the nitrogen-hydrogen-doped diamond-like carbon layer using radio frequency sputtering deposition.

Detailed features of the present method for manufacturing molds having multilayer diamond-like carbon coatings will become more apparent from the following detailed description and claims, and the accompanying drawings.

BRIEF DESCRIPTION OF THE DRAWINGS

Many aspects of the present method can be better understood with reference to the following drawings. The components in the drawings are not necessarily drawn to scale, the emphasis instead being placed upon clearly illustrating the principles of the present method. Moreover, in the drawings, like reference numerals designate corresponding parts throughout the several views, wherein.

DETAILED DESCRIPTION OF PREFERRED EMBODIMENTS

Reference will now be made to the drawings to describe the preferred embodiments of the present molds that have a multilayer diamond-like carbon film in detail.

Figure 1:
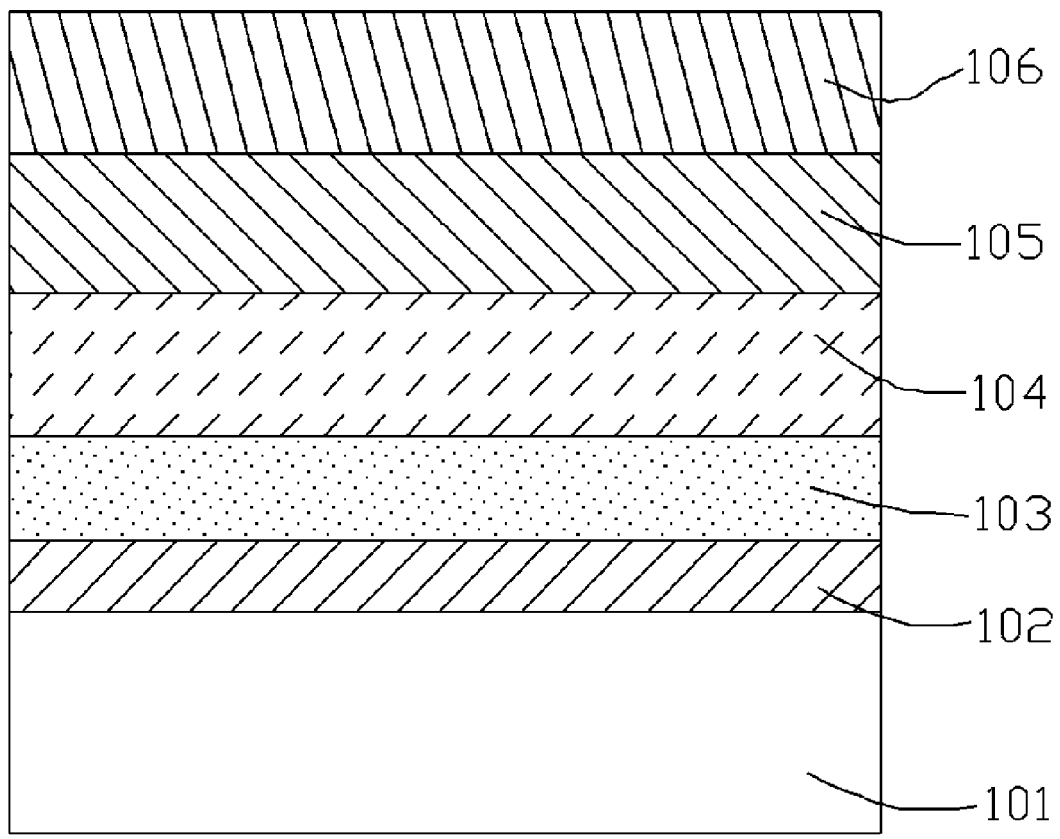
FIG. 1 is a cross sectional view of a mold that has a multilayer diamond-like carbon film according to a first embodiment.
Figure 2:
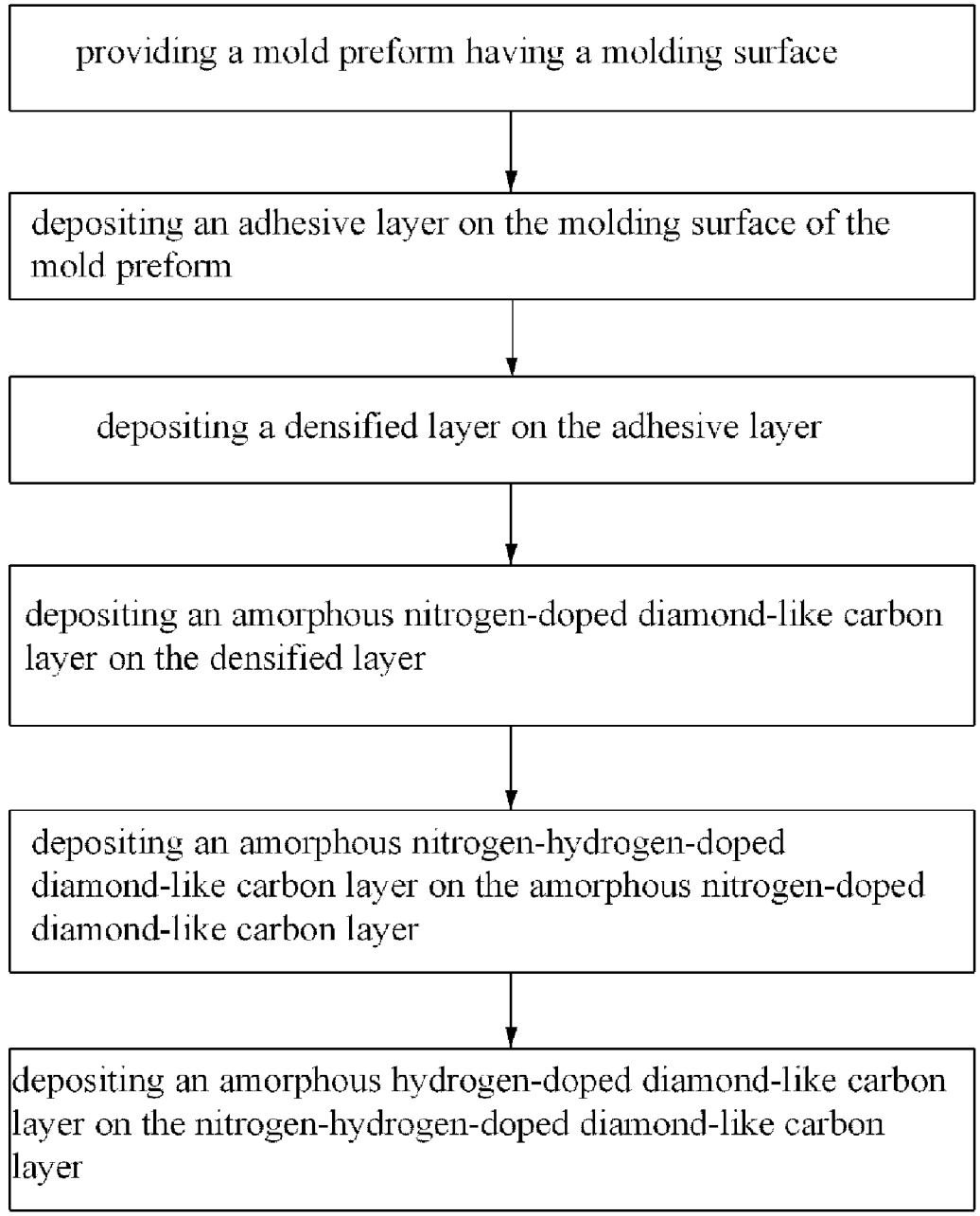
FIG. 2 is a flowchart illustrating a method for manufacturing a mold having the multilayer DLC film according to a second embodiment.
Figure 3A:
FIGS. 3A~3F are cross sectional views showing successive steps of the method for making the mold having the multilayer DLC film; and, FIG. 4 is a schematic diagram illustrating an exemplary radio frequency sputtering system for manufacturing molds having multilayer DLC film.
Figure 3B:
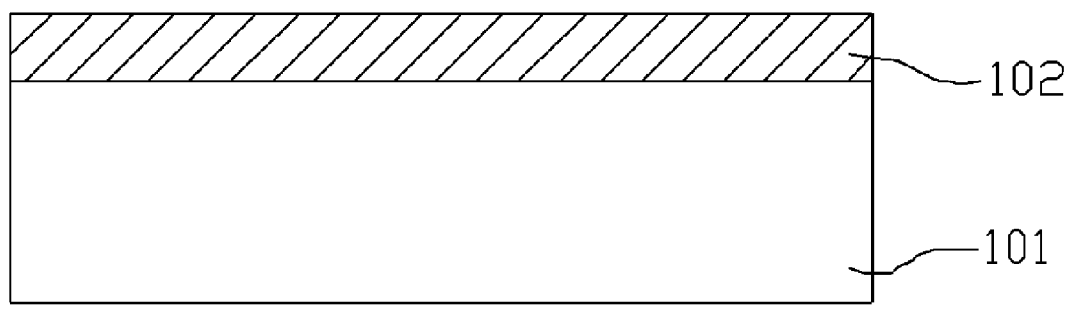
Figure 3C:
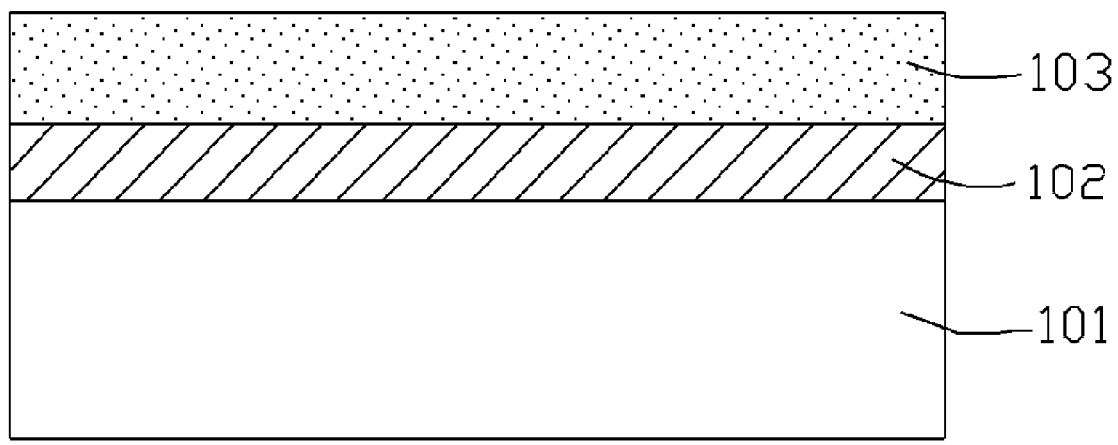
Figure 3D:
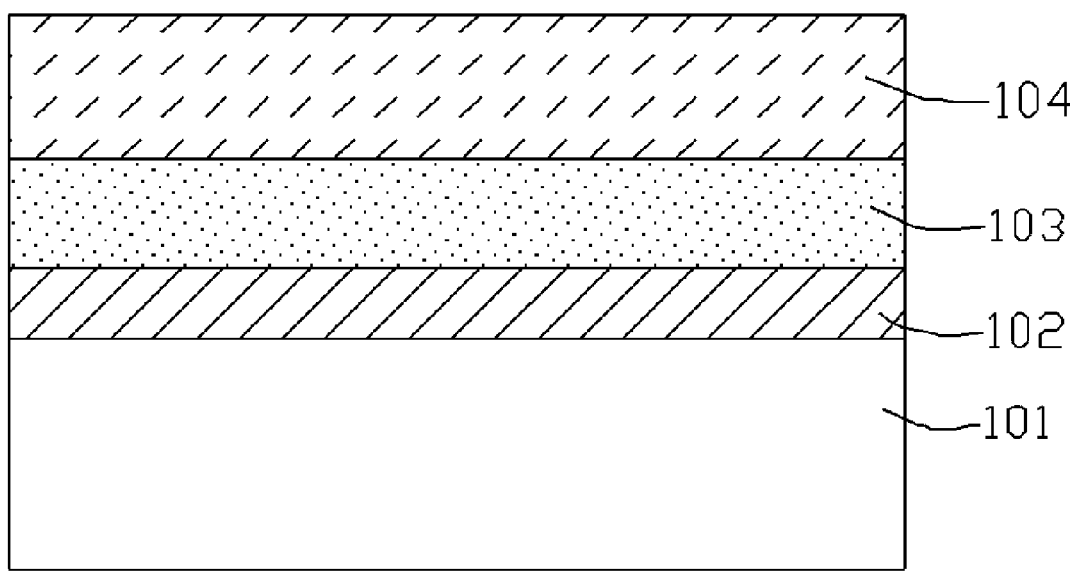
Figure 3E:
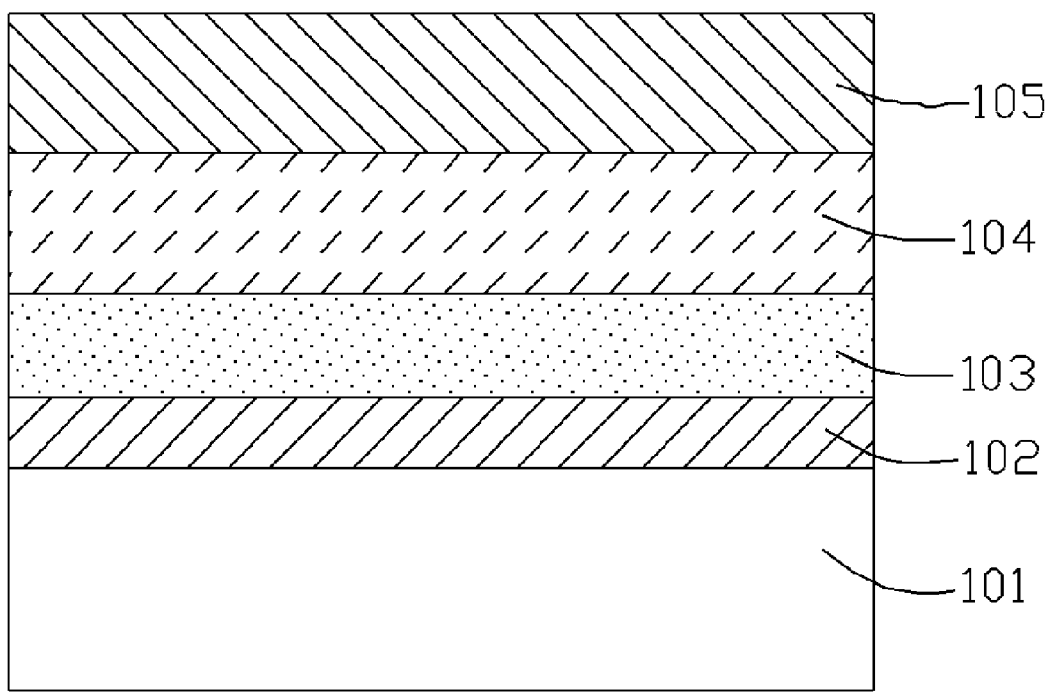
Figure 3F:
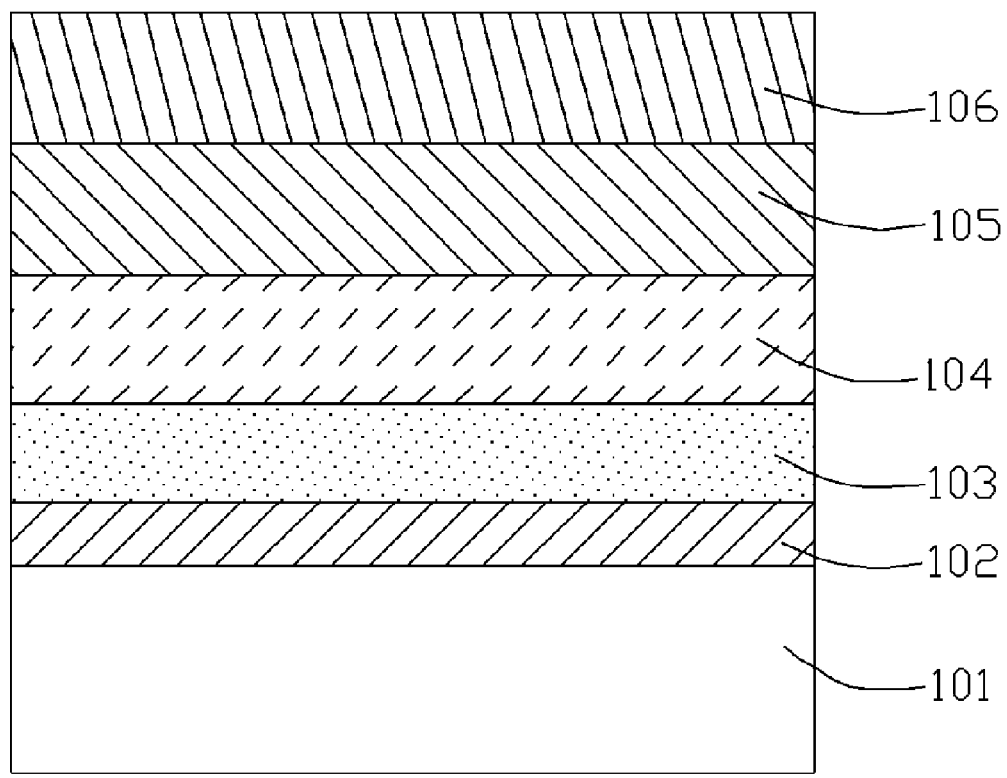

Referring now particularly to FIG. 1, where a mold 10 having a multilayer diamond-like carbon film according to a first embodiment is shown. The mold 10 includes a molding surface 101; an adhesive layer 102 formed on the molding surface 101; a densified layer 103 formed on the adhesive layer 102, the adhesive layer 102 being configured for enhancing bonding strength between the densified layer 103 and the molding surface 101, and the densified layer 103 being configured for enhancing a density of the multilayer diamond-like carbon film; an amorphous nitrogen-doped diamond-like carbon layer 104 on the densified layer 103; an amorphous nitrogen-hydrogen-doped diamond-like carbon layer 105 formed on the amorphous nitrogen-doped diamond-like carbon layer 104; and an amorphous hydrogen-doped diamond-like carbon layer 106 formed on the nitrogen-hydrogen-doped diamond-like carbon layer 105.

Referring to FIG. 2 and FIG. 3A~3F, a method for manufacturing the mold 10 having a multilayer diamond-like carbon film according to a second embodiment includes the steps of:

(1) providing a mold preform 101 having a molding surface;

(2) depositing an adhesive layer 102 on the molding surface of the mold preform 101 using a radio frequency sputtering deposition;

(3) depositing a densified layer 103 on the adhesive layer 102 using radio frequency sputtering deposition;

(4) depositing an amorphous nitrogen-doped diamond-like carbon layer 104 on the densified layer 103 using radio frequency sputtering deposition;

(5) depositing an amorphous nitrogen-hydrogen-doped diamond-like carbon layer 105 on the amorphous nitrogen-doped diamond-like carbon layer 104 using radio frequency sputtering deposition;

(6) depositing an amorphous hydrogen-doped diamond-like carbon layer 106 on the nitrogen-hydrogen-doped diamond-like carbon layer 105 using radio frequency sputtering deposition.

In step (1), the mold preform 101 is made of a material selected from a group consisting of iron-chromium-carbon alloy, iron-chromium-molybdenum-carbon alloy, iron-chromium-vanadium-molybdenum-carbon alloy and iron-chromium-vanadium-silicon-molybdenum-carbon alloy.

Figure 4:
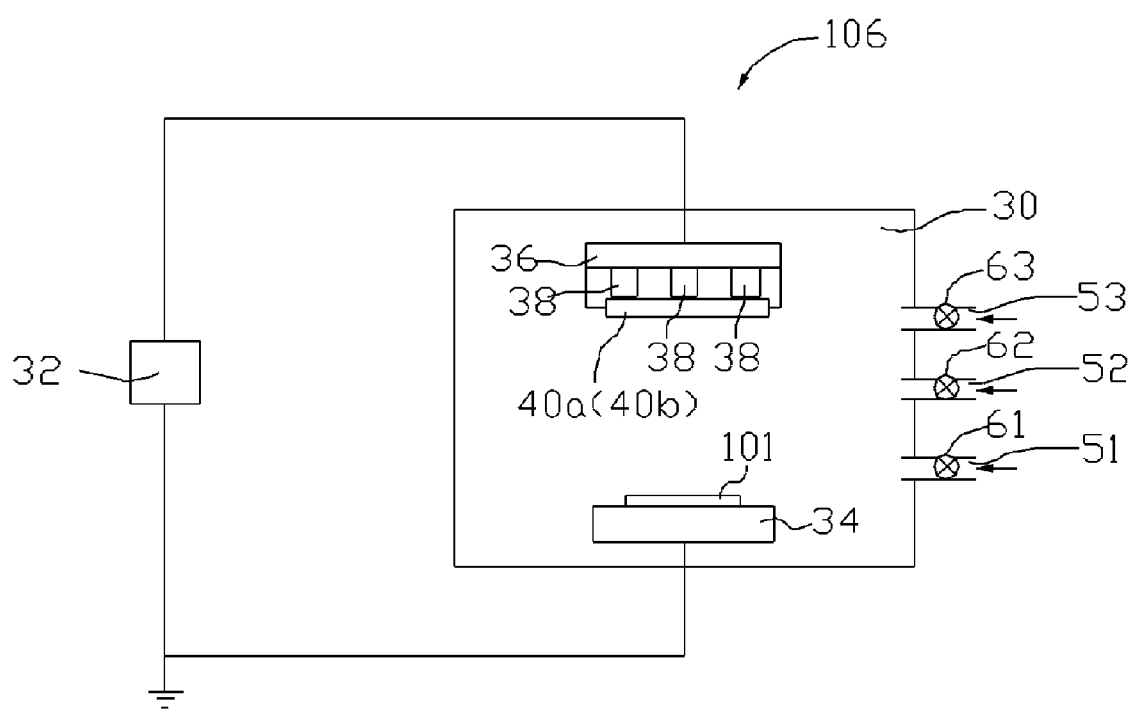

In step (2), the adhesive layer 102 is configured for enhancing bonding strength between the densified layer 103 and the molding surface of the mold preform 101. The adhesive layer 102 is deposited on the main plane of the mold preform 101 using radio frequency sputtering deposition from a radio frequency sputtering system 20. The radio frequency sputtering system 20 can be a RF magnetron sputtering system for a pulsed RF sputtering system. Referring to FIG. 4, in an exemplary RF magnetron sputtering system 20 includes a sputtering chamber 30, a RF power supply 32, a first pole table 34, a second pole table 36 opposite to the first pole table 34. The sputtering chamber 30 has a sidewall on which an outlet 51, a first inlet 52 and a second inlet 53 are defined. The outlet 51, first inlet 52 and second inlet 53 are controlled by valves 61, 62 and 63 respectively. The radio frequency power supply 32 communicates with the first pole table 34 and the second pole table 36. The second pole table 36 has a plurality of magnetic poles 38. The adhesive layer 102 is deposited on the main plane of the mold preform 101 by a method including the steps of: (a) placing the mold preform 101 on the first pole table 34 and placing a metal target 40a on the second pole table 36; (b) opening the valve 61 and vacuumizing the sputtering chamber 30; (c) opening the valve 62 and introducing an inert gas into the sputtering chamber 30; (d) activating the RF power supply 32 and sputtering an adhesive layer 102 on the main plane of the mold preform 101. The metal target 40a is made of a material selected from a group consisting of chromium, titanium and chromium titanium alloy. The inert gas is elected from a group consisting of argon gas, krypton gas, xenon gas and radon gas. The sputtering frequency is at about 13.56 megahertz (MHz). The adhesive layer 102 has a thickness in a range from approximately 1~20 nanometers. Preferably, the thickness of the adhesive layer 102 is in a range from approximately 4~10 nanometers.

In step (3), the densified layer 103 is configured for enhancing a density of the multilayer film. The densified layer 103 is formed on the adhesive layer 102 by a process similar to step (2) except that, in step (c) the valve 63 is opened to introduce a nitrogen gas into the sputtering chamber 30 where the nitrogen gas and the inert gas together form a mixed gas. The densified layer 103 is made of a material selected from a group consisting of chromium nitride (CrN), titanium nitride (TiN), and chromium-titanium nitride (CrTiN). The densified layer 103 has a thickness in a range from approximately 1~50 nanometers. Preferably, the thickness of the densified layer 103 is in a range from approximately 4~30 nanometers.

In step (4), the amorphous nitrogen-doped DLC layer 104 is formed on the densified layer 103 by a process similar to step (3) except that, in step (a) the metal target 40a was replaced by a carbon target 40b, and in step (c) the valve 63 is opened to introduce a nitrogen gas into the sputtering chamber 30 where the nitrogen gas and the inert gas together form a mixed gas. The volume ratio of the nitrogen gas to the mixed gas is in a range from 2~40 percent. Preferably, the volume ratio of the nitrogen gas to the mixed gas is in a range from 5~20 percent. The amorphous nitrogen-doped DLC layer 104 has a thickness in a range from approximately 1~50 nanometers. Preferably, the thickness of the amorphous nitrogen-doped DLC layer 104 is in a range from approximately 10~30 nanometers.

In step (5), the amorphous nitrogen-hydrogen-doped DLC layer 105 is formed on the amorphous nitrogen-doped DLC layer 104 by a process similar to step (3) except that, in step (c), the valve 63 is opened to introduce a nitrogen-hydrogen mixed gas into the sputtering chamber 30 where the nitrogen gas, the hydrogen gas and the inert gas together form a mixed gas. The volume ratio of the nitrogen gas to the mixed gas is in a range from 2~10 percent. The volume ratio of the hydrogen gas to the mixed gas is in a range from 5~20 percent. The amorphous nitrogen-hydrogen-doped DLC layer 105 has a thickness in a range from approximately 1~50 nanometers. Preferably, the thickness of the amorphous nitrogen-hydrogen-doped DLC layer 105 is in a range from approximately 10~30 nanometers.

In step (6), the amorphous hydrogen-doped DLC layer 106 is formed on the amorphous nitrogen-hydrogen-doped DLC layer 105 by a process similar to step (3) except that, in step (c), the valve 63 is opened to introduce a hydrogen gas into the sputtering chamber 30 where the hydrogen gas and the inert gas together form a mixed gas. The volume ratio of the hydrogen gas to the mixed gas is in a range from 5~20 percent. The amorphous hydrogen-doped DLC layer 106 has a thickness in a range from approximately 1~50 nanometers. Preferably, the thickness of the amorphous hydrogen-doped DLC layer 106 is in a range from approximately 10~30 nanometers.

In a preferred embodiment of above-mentioned method for manufacturing a mold having multilayer diamond-like carbon films, the sputtering frequency of the sputtering system is set at about 13.56 megahertz.

Manufacturing of the mold 10 by the above-described method includes three DLC layers. The DLC layers have favorable adhesion, high corrosion resistance, lower friction coefficient, good tribology and good wear resistance thus prolonging the lifetime of the mold.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A method for manufacturing a mold having a multilayer diamond-like carbon film, the method comprising the steps of:
   providing a mold preform having a molding surface;
   depositing an adhesive layer on the molding surface of the mold preform using radio frequency sputtering deposition;
   depositing a densified layer on the adhesive layer using radio frequency sputtering deposition, the adhesive layer being configured for enhancing bonding strength between the densified layer and the molding surface of the mold preform, and the densified layer being configured for enhancing a density of the multilayer diamond-like carbon film;
   depositing an amorphous nitrogen-doped diamond-like carbon layer on the densified layer using radio frequency sputtering deposition;
   depositing an amorphous nitrogen-hydrogen-doped diamond-like carbon layer on the amorphous nitrogen-doped diamond-like carbon layer using radio frequency sputtering deposition; and
   depositing an amorphous hydrogen-doped diamond-like carbon layer on the nitrogen-hydrogen-doped diamond-like carbon layer using radio frequency sputtering deposition.

2. The method for manufacturing a mold having a multilayer diamond-like carbon film according to claim 1, wherein the molding preform is comprised of a material selected from a group consisting of iron-chromium-carbon alloy, iron-chromium-molybdenum-carbon alloy, iron-chromium-vanadium-molybdenum-carbon alloy and iron-chromium-vanadium-silicon-molybdenum-carbon alloy.

3. The method for manufacturing a mold having a multilayer diamond-like carbon film according to claim 1, wherein the radio frequency sputtering deposition is magnetron radio frequency sputtering deposition.

4. The method for manufacturing a mold having a multilayer diamond-like carbon film according to claim 1, wherein the adhesive layer is deposited by sputtering a target comprised of a material selected from a group consisting of chromium, titanium and chromium titanium alloy.

5. The method for manufacturing a mold having a multilayer diamond-like carbon film according to claim 4, wherein a sputtering frequency is at about 13.56 megahertz.

6. The method for manufacturing a mold having a multilayer diamond-like carbon film according to claim 1, wherein the adhesive layer has a thickness in a range from approximately 1~20 nanometers.

7. The method for manufacturing a mold having a multilayer diamond-like carbon film according to claim 6, wherein the adhesive layer has a thickness in a range from approximately 4~10 nanometers.

8. The method for manufacturing a mold having a multilayer diamond-like carbon film according to claim 1, wherein the densified layer has a thickness in a range from approximately 1~50 nanometers.

9. The method for manufacturing a mold having a multilayer diamond-like carbon film according to claim 8, wherein the densified layer has a thickness in a range from approximately 4~30 nanometers.

10. The method for manufacturing a mold having a multilayer diamond-like carbon film according to claim 1, wherein the amorphous nitrogen-doped diamond-like carbon layer is sputtered using a mixed gas of nitrogen gas and inert gas, and a percentage by volume of the nitrogen gas to the mixed gas is in a range from approximately 2~40 percent.

11. The method for manufacturing a mold having a multilayer diamond-like carbon film according to claim 10, wherein a percentage by volume of the nitrogen gas to the mixed gas is in a range from approximately 5~20 percent.

12. The method for manufacturing a mold having a multilayer diamond-like carbon film according to claim 1, wherein the amorphous nitrogen-doped diamond-like carbon layer has a thickness in a range from approximately 1~50 nanometers.

13. The method for manufacturing a mold having a multilayer diamond-like carbon film according to claim 12, wherein the amorphous nitrogen-doped diamond-like carbon layer has a thickness in a range from approximately 10~30 nanometers.

14. The method for manufacturing a mold having a multilayer diamond-like carbon film according to claim 1, wherein the amorphous nitrogen-hydrogen-doped diamond-like carbon layer is sputtered using a mixed gas of nitrogen gas, hydrogen gas and inert gas, a percentage by volume of the nitrogen gas to the mixed gas is in a range from approximately 2~10 percent, and a percentage by volume of the hydrogen gas to the mixed gas is in a range from approximately 5~20 percent.

15. The method for manufacturing a mold having a multilayer diamond-like carbon film according to claim 1, wherein the amorphous nitrogen-hydrogen-doped diamond-like carbon layer has a thickness in a range from approximately 1~50 nanometers.

16. The method for manufacturing a mold having a multilayer diamond-like carbon film according to claim 15, wherein the amorphous nitrogen-hydrogen-doped diamond-like carbon layer has a thickness in a range from approximately 10~30 nanometers.

17. The method for manufacturing a mold having a multilayer diamond-like carbon film according to claim 1, wherein the amorphous hydrogen-doped diamond-like carbon layer is sputtered using a mixed gas of hydrogen gas and inert gas, and a percentage by volume of the hydrogen gas to the mixed gas is in a range from approximately 5~20 percent.

18. The method for manufacturing a mold having a multilayer diamond-like carbon film according to claim 1, wherein the amorphous hydrogen-doped diamond-like carbon layer has a thickness in a range from approximately 1~50 nanometers.

19. The method for manufacturing a mold having a multilayer diamond-like carbon film according to claim 18, wherein the amorphous hydrogen-doped diamond-like carbon layer has a thickness in a range from approximately 10~30 nanometers.

\* \* \* \* \*